United States Patent [19]

Hirao et al.

[11] Patent Number: 5,795,409
[45] Date of Patent: Aug. 18, 1998

[54] SURFACE TREATING AGENT FOR COPPER OR COPPER ALLOY

[75] Inventors: Hirohiko Hirao; Yoshimasa Kikukawa, both of Kagawa, Japan

[73] Assignee: Shikoku Chemicals Corporation, Kagawa, Japan

[21] Appl. No.: 805,055

[22] Filed: Feb. 24, 1997

[30] Foreign Application Priority Data

Feb. 26, 1996 [JP] Japan ................... 8-065490
Sep. 19, 1996 [JP] Japan ................... 8-271722

[51] Int. Cl.⁶ .................................. C23C 22/05
[52] U.S. Cl. ................ 148/269; 106/14.13; 106/14.16
[58] Field of Search ............... 106/14.13, 14.16; 148/269

[56] References Cited

U.S. PATENT DOCUMENTS 5,173,130 12/1992 Kinoshita ..................... 148/269

FOREIGN PATENT DOCUMENTS

| 56-18077 | 4/1981 | Japan | C23F 7/00 |
| 6-81161 | 3/1994 | Japan | C23C 22/05 |
| 7-166381 | 6/1995 | Japan | C23F 11/00 |

*Primary Examiner*—Sam Silverberg
*Attorney, Agent, or Firm*—Sughrue, Mion, Zinn, Macpeak & Seas, PLLC

[57] ABSTRACT

A surface treating agent for copper and a copper alloy, comprising an aqueous solution containing an imidazole compound or a benzimidazole compound, a complexon, and iron ions. The agent forms a chemical film selectively on the surface of copper while forming no film on other metals.

4 Claims, 2 Drawing Sheets

FILM THICKNESS ON COPPER SURFACE

FILM THICKNESS ON GOLD SURFACE

5,795,409

SURFACE TREATING AGENT FOR COPPER OR COPPER ALLOY

FIELD OF THE INVENTION

The present invention relates to an aqueous solution type surface treating agent which forms a chemical film on the surface of copper or a copper alloy. The surface treating agent of the present invention is particularly effective for the treatment of copper circuit of a rigid printed wiring board (hereinafter abbreviated as PWB) or a flexible PWB having metallic parts other than copper or a copper alloy, such as gold- or solder-plated parts.

BACKGROUND OF THE INVENTION

Surface treatment methods of forming a film of an imidazole compound having a long-chain alkyl group at the 2-position on the surface of copper or a copper alloy are described in JP-B-46-17046 (the term "JP-B" as used herein means an "examined published Japanese patent application"), JP-B-48-11454, JP-B-48-25621, JP-B-49-1983, JP-B-49-26183, JP-B-58-22545, JP-B-61-41988, and JP-A-61-90492 (the term "JP-A" as used herein means an "unexamined published Japanese patent application"). Surface treatment methods of forming a film of an imidazole compound having an aryl group at the 2-position on the surface of copper or a copper alloy are described in JP-A-4-202780 and JP-A-4-20668.

Other known methods for surface treating copper or a copper alloy to form a film of a benzimidazole compound include a method of using 5-methylbenzimidazole as disclosed in JP-A-58-501281 and a method of using a 2-alkylbenzimidazole compound, a 2-arylbenzimidazole compound, a 2-aralkylbenzimidazole compound or a 2-mercaptoalkylbenzimidazole compound as disclosed in JP-A-3-124395, JP-A-3-236478, JP-A-4-72072, JP-A-4-80375, JP-A-4-99285, JP-A-4-157174, JP-A-4-165083, JP-A-4-173983, JP-A-4-183874, JP-A-4-202780, JP-A-4-206681, JP-A-4-218679, JP-A-5-25407, JP-A-5-93280, J-A-5-93281, JP-A-5-156475, JP-A-5-163585, JP-A-5-175643, JP-A-5-186880, JP-A-5-186888, JP-A-202492, JP-A-5-230674, JP-A-5-237688, JP-A-5-263275, JP-A-5-287562, JP-A-5-291729, JP-A-5-287563, JP-A-5-291729, JP-A-6-2158, JP-A-6-2176, JP-A-6-173021, JP-A-6-173022, and JP-A-6-173023.

Further, anticorrosion treatment for copper or a copper alloy with 2-mercaptobenzimidazole is described in JP-A-55-83157, JP-A-62-77600, and JP-A-63-118598.

Surface treatment of copper or a copper alloy with a treating agent containing a chelating agent is disclosed in JP-B-56-18077, JP-A-6-81161, and JP-A-7-166381.

In recent years, in order to achieve high-density surface mounting on PWB, the number of terminals of circuit components have been increasing, and the pitch of the terminals has been made finer. With this tendency, use of TAB (tape automated bonding), COB (chip on board), and flip chip bonding has been extending.

For surface mounting of such components, PWB having a copper wiring pattern partly plated with gold, silver, aluminum, tin or solder is employed, and the surface treatment of the copper circuit of this type of PWB has been growing in importance. That is, it has been demanded to develop a water-soluble surface treating agent which has such selectivity as to form a chemical film only on the surface of copper or a copper alloy but no-film on the surface of different metals, such as gold and solder, and which exhibits satisfactory film-forming properties and requires a reduced treating time, i.e., excellent workability.

The conventional surface treatment methods using a 2-(long-chain alkyl)imidazole compound (JP-B-46-17046, etc.), a 2-arylimidazole compound (JP-A-4-202780, etc.) and various benzimidazole compounds (JP-A-3-124395, etc.) each have a disadvantage that the surface of the different metal (e.g., gold or solder) undergoes change in color or a chemical film is formed on not only copper or a copper alloy but the different metal.

Therefore, when a PWB plated, in parts, with gold, silver, aluminum, tin, solder, etc. is surface treated by these conventional methods, the surface of the different metal (e.g., gold or solder) must be previously protected with a masking tape to prevent color change thereof or chemical film formation thereon, or a chemical film formed on the different metal must be removed afterward with an alcohol, etc. Such countermeasures require much labor and cost.

According to JP-B-56-18077 and JP-A-6-81161, a surface treating agent containing an imidazole compound or a benzimidazole compound and a complexon, such as ethylenediaminetetraacetic acid or diethylenetriaminepentaacetic acid, has selectivity in film formation, i.e., forming a chemical film only on the surface of copper but not on the surface of different metals, such as a gold-plated surface. In these techniques, a complexon which captures copper ions in the surface treating solution to achieve stabilization is used in order to suppress film formation on the gold-plated surface.

However, a copper ion in the surface treating solution is a very effective means for improving chemical film-forming properties on the surface of copper. Therefore, the surface treating solution used in the above methods is extremely inferior in chemical film-forming properties on the surface of copper due to lack of copper ions, requiring 2 to 3 minutes for accomplishment of surface treatment, which is far longer than 10 to 30 seconds as in the case of using a surface treating solution containing copper ions. In other words, the methods achieve selectivity in chemical film formation at the cost of productivity.

JP-A-7-166381 discloses a method of using a treating agent containing an imidazole compound or a benzimidazole compound and a complex between a metal having a higher ionization tendency than copper and a β-diketone. This method still fails to inhibit chemical film formation on different metal-plated parts on PWB. Thus, it has been demanded to develop a highly selective and productive surface treating method for forming a chemical film only on the surface of copper, which is useful for high-density surface mounting.

In order to mount the latest QFP of small pitch, a demand for a board having copper circuit and solder-plated part (hereinafter, a solder-copper mixed board), in which solder has previously been supplied on the copper where QFP is to be mounted, has been increasing. Mounting of QFP has conventionally been carried out by printing solder paste on the copper where QFP is to be mounted, and QFP is then bonded thereto by reflow soldering. Since it is very difficult to print solder paste for the latest QFP of small pitch, a solder-copper mixed board previously having supplied thereon solder on copper by supersoldering (partly solder plating) or solder plating is employed.

However, when such a solder-copper mixed board is treated with a known surface treating solution containing an imidazole compound or a benzimidazole compound and copper ions, color change of the solder and denaturation of the surface treating solution occur, making long-term continuous treatment impossible.

3

The color change of solder of the solder-copper mixed board as referred to above means a change from a silver luster to a dirty brown or black color on immersion in the surface treating solution, and the denaturation of the surface treating solution as referred to above means a gradual change in composition as treatment of the solder-copper mixed board proceeds, sometimes resulting in precipitation.

SUMMARY OF THE INVENTION

An object of the invention is to provide a highly selective and productive surface treating method for forming a chemical film only on the surface of copper or a copper alloy, which is advantageous for high-density surface mounting on PWB.

As a result of extensive researches and tests, the inventors of the invention have found that the above object of the invention is accomplished by using, as a copper or copper alloy surface treating agent, an aqueous solution essentially containing an imidazole compound or a benzimidazole compound, a complexon and a water-soluble iron compound. The invention has been completed based on this finding.

The invention provides a surface treating agent for copper or a copper alloy, comprising an aqueous solution containing an imidazole compound or a benzimidazole compound, a complexon, and iron ions.

DETAILED DESCRIPTION OF THE INVENTION

Figure 1:
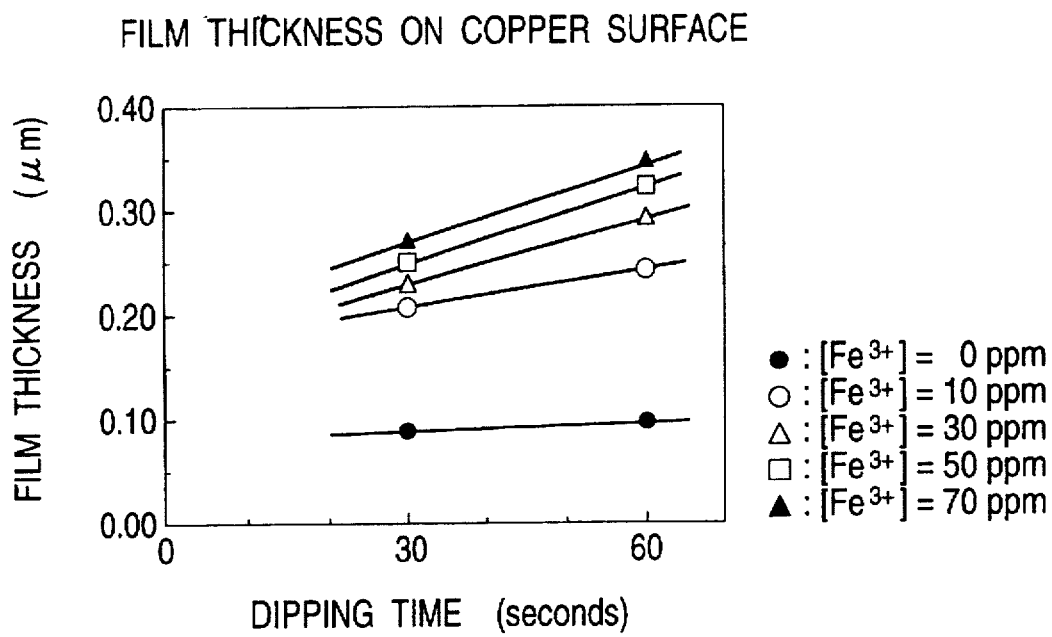
FIG. 1 shows the relationship between the treating time and the film-forming properties on copper of the surface treating agent of Example 1.

Typical examples of the imidazole compound and benzimidazole compound which can be suitably used in the practice of the present invention include 2-alkylimidazole compounds, e.g., 2-pentylimidazole, 2-undecyl-4-methylimidazole, and 2,4-dimethylimidazole; 2-arylimidazole compounds, e.g., 2-phenylimidazole, 2-toluylimidazole, 2-phenyl-4-methylimidazole, 2-phenyl-4-benzylimidazole, 2-phenyl-4-methyl-5-benzylimidazole, 2,4-diphenylimidazole, and 2,4,5-triphenylimidazole; 2-aralkylimidazole compounds, e.g., 2-benzylimidazole, 2-benzyl-4-methylimidazole, 2-phenylethylimidazole, 2-(2-phenylethyl)imidazole, and 2-(2-phenylpentyl)imidazole; 2-alkylbenzimidazole compounds, e.g., 2-propylbenzimidazole, 2-pentylbenzimidazole, 2-octylbenzimidazole, 2-nonylbenzimidazole, 2-hexyl-5-methylbenzimidazole, 2-(2-methylpropyl)benzimidazole, 2-(1-ethylpropyl)benzimidazole, and 2-(1-ethylpentyl)benzimidazole; 2-(cycloalkyl)benzimidazole compounds, e.g., 2-cyclohexylbenzimidazole, 2-(2-cyclohexylethyl)benzimidazole, and 2-(5-cyclohexylpentyl)benzimidazole; 2-arylbenzimidazole compounds, e.g., 2-phenylbenzimidazole and 2-phenyl-5-methylbenzimidazole; 2-aralkylbenzimidazole compounds, e.g., 2-benzylbenzimidazole, 2-(2-phenylethyl) benzimidazole, 2-(5-phenylpentyl)benzimidazole, 2-(3-phenylpropyl)-5-methylbenzimidazole, 2-(4-chlorobenzyl) benzimidazole, 2-(3,4-dichlorobenzyl)benzimidazole, and 2-(2,4-dichlorobenzyl)benzimidazole; 2-(mercaptomethyl) benzimidazole, 2-(2-aminoethyl)benzimidazole, 2,2'-ethylenedibenzimidazole, 2-(1-naphthylmethyl) benzimidazole, 2-(2-pyridyl)benzimidazole, 2-(2-phenylvinyl)benzimidazole, 2-(phenoxymethyl) benzimidazole, and 2-(phenoxymethyl)-S-methylbenzimidazole.

Typical examples of the complexons to be used in the practice of the present invention include iminodiacetic acid (IDA), nitrilotriacetic acid (NTA), ethylenediaminetetraacetic acid (EDTA), diethylenetriaminepentaacetic acid (DTPA), triethylenetetraminehexaacetic acid (TTHA), 1,2-diaminocyclohexanetetraacetic acid (CyDTA), glycol ether diaminetetraacetic acid (GEDTA), N,N-bis(2-hydroxybenzyl)ethylenediaminediacetic acid (HBED), ethylenediaminedipropionic acid (EDDP), ethylenediaminediacetic acid (EDDA), diaminopropanoltetraacetic acid (DPTA-OH), hexamethylenediaminetetraacetic acid (HDTA), hydroxyethyliminodiacetic acid (HIDA), diaminopropanetetraacetic acid (methyl-EDTA), nitrilotripropionic acid (NTP), ethylenediaminetetrakismethylenephosphonic acid (EDTPO), and nitrilotrismethylenephosphonic acid (NTPO), and salts of these acids.

Typical examples of iron compounds which are suited for supplying iron ions indispensable to the practice of the present invention are iron (II) chloride, iron (III) chloride, iron (II) bromide, iron (III) bromide, iron (II) nitrate, iron (III) nitrate, iron (II) sulfate, iron (III) sulfate, iron (II) perchlorate, iron (III) perchlorate, iron (II) ammonium sulfate, iron (III) ammonium sulfate, iron (III) ammonium citrate, iron (III) ammonium oxalate, iron (III) citrate, iron (III) 2-ethylhexanoate, iron (II) fumarate, iron (II) lactate, and iron (II) oxalate.

In carrying out the present invention, the imidazole compound or benzimidazole compound is used in an amount of 0.01 to 10% by weight, preferably 0.1 to 5% by weight, based on the aqueous solution; the iron compound 0.0001 to 5% by weight, preferably 0.001 to 1% by weight, based on the aqueous solution; and the complexon 1 to 10 mol, preferably 1 to 5 mol, per molar concentration of iron ions.

It is preferable that the complexon, irrespective of the kind, be added in a concentration higher than the necessary minimum so as to form a stable chelate compound with an iron ion.

In the practice of the present invention, an organic or inorganic acid or a small amount of an organic solvent can be used in combination in order to water-solubilize the imidazole or benzimidazole compound. Useful organic acids include formic acid, acetic acid, propionic acid, butyric acid, heptanoic acid, caprylic acid, capric acid, lauric acid, glycolic acid, lactic acid, acrylic acid, benzoic acid, p-nitrobenzoic acid, p-toluenesulfonic acid, salicylic acid, picric acid, oxalic acid, succinic acid, maleic acid, fumaric acid, tartaric acid, and adipic acid. Useful inorganic acids include hydrochloric acid, phosphoric acid, sulfuric acid, and nitric acid. The acid is added in an amount of from 0.01 to 40% by weight, preferably 0.2 to 20% by weight, based on the aqueous solution.

Useful organic solvents are those miscible with water, such as lower alcohols, e.g., methanol, ethanol and isopropyl alcohol, acetone, and N,N-dimethylformamide.

The surface treatment of copper or a copper alloy with the surface treating agent of the present invention is suitably carried out by dipping, spraying or coating at a liquid temperature of about 20° to 60° C. for a contact time of from 1 second to 10 minutes.

The surface treating solution according to the present invention forms a chemical film selectively on the surface of copper or a copper alloy but forms no film on the surface of the different metals, such as a gold- or solder-plated surface. Accordingly, when used for the surface treatment of PWB having the parts of different metals, such as gold-plated parts or solder-plated parts, on the copper wiring pattern, only the copper circuit can be surface-treated without masking the different metals. Further, since the treating solution of the invention exhibits satisfactory film-forming properties on the copper metal and excellent stability during use, it brings about a marked improvement in productivity in the production of PWB of this kind.

The present invention will now be illustrated in greater detail with reference to Examples, but it should be understood that the invention is not construed as being limited thereto.

In Examples, the thickness of a chemical film formed on a metallic surface, i.e., copper or gold, was measured as follows. A PWB having a test pattern composed of copper wiring and gold-plated parts (hereinafter referred to as test pattern 1) was dipped in a surface treating solution to form a chemical film on the copper surface and the gold-plated surface. Each of the copper part and the gold-plated part was cut into a prescribed size, and the cut test piece was immersed in a 0.5% hydrochloric acid aqueous solution to dissolve the film. The concentration of the active ingredient dissolved in the hydrochloric acid aqueous solution was measured with an ultraviolet spectrophotometer and converted to the chemical film thickness.

Unless otherwise indicated, all the percents are by weight.

EXAMPLE 1

To an aqueous solution containing 0.4% 2-octylbenzimidazole, 5.0% acetic acid, and 0.063% EDTA (2.15 mM) was added iron (III) chloride hexahydrate to give an iron ion concentration of 10 ppm (0.18 mM), 30 ppm (0.54 mM), 50 ppm (0.89 mM) or 70 ppm (1.26 mM) to prepare a surface treating solution having a varied iron ion concentration. A PWB having test pattern 1 was dipped in the resulting surface treating solution at 40° C. for 30 seconds or 60 seconds, and the thickness of the thus formed film on the copper surface and the gold surface was measured.

Figure 2:
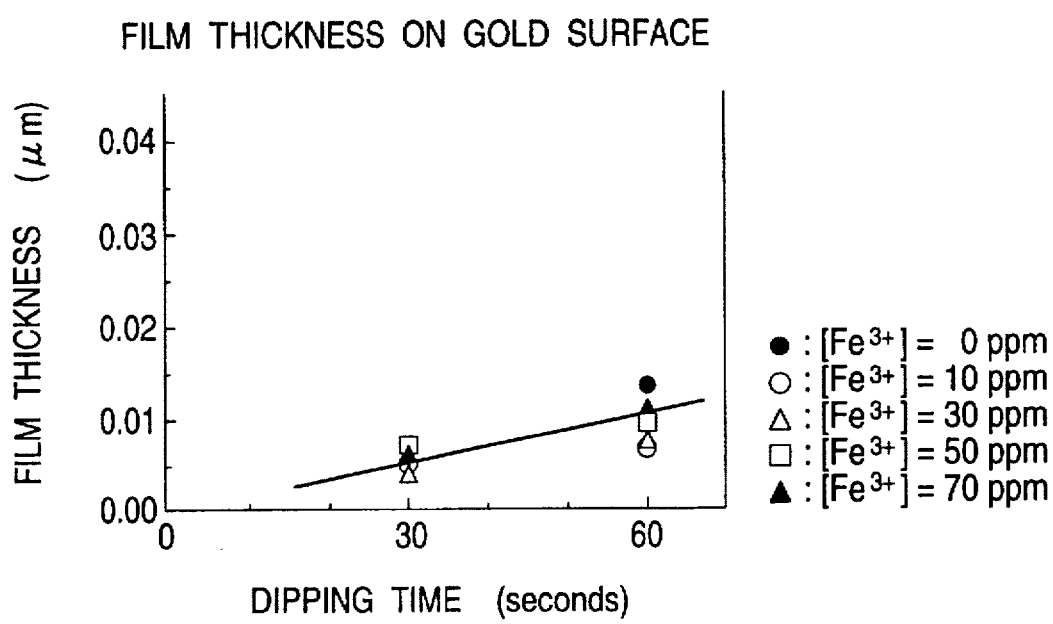
FIG. 2 shows the relationship between the treating time and the film-forming properties on gold of the surface treating agent of Example 1.

The results were plotted to give a relationship of film forming rate on the copper surface and the gold-plated surface vs. iron ion concentration of the surface treating solution as shown in FIGS. 1 and 2. It is seen from the Figures that chemical film formation on the gold-plated surface is substantially inhibited by adding a trace amount of iron ions to the surface treating solution containing a complexon and that the chemical film formation on the copper surface is selectively achieved in a short time.

Further, a solder-copper mixed board was dipped in a surface treating aqueous solution containing 0.4% 2-octylbenzimidazole, 5.0% acetic acid, 0.024% of iron (III) chloride hexahydrate (Fe ion=50 ppm), and 0.063% EDTA at 40° C. for 60 seconds. Color change of the solder, denaturation of the surface treating solution, and film-forming properties on the copper surface as observed are shown in Table 1 below.

EXAMPLE 2

Figure 3:
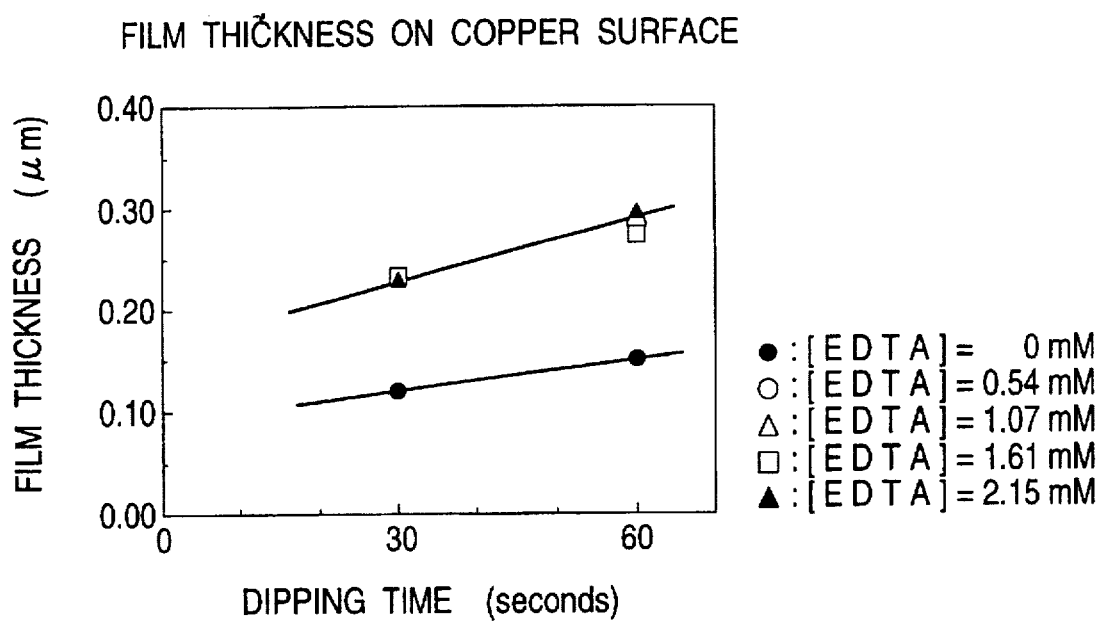
FIG. 3 shows the relationship between the treating time and the film-forming properties on copper of the surface treating agent of Example 2.
Figure 4:
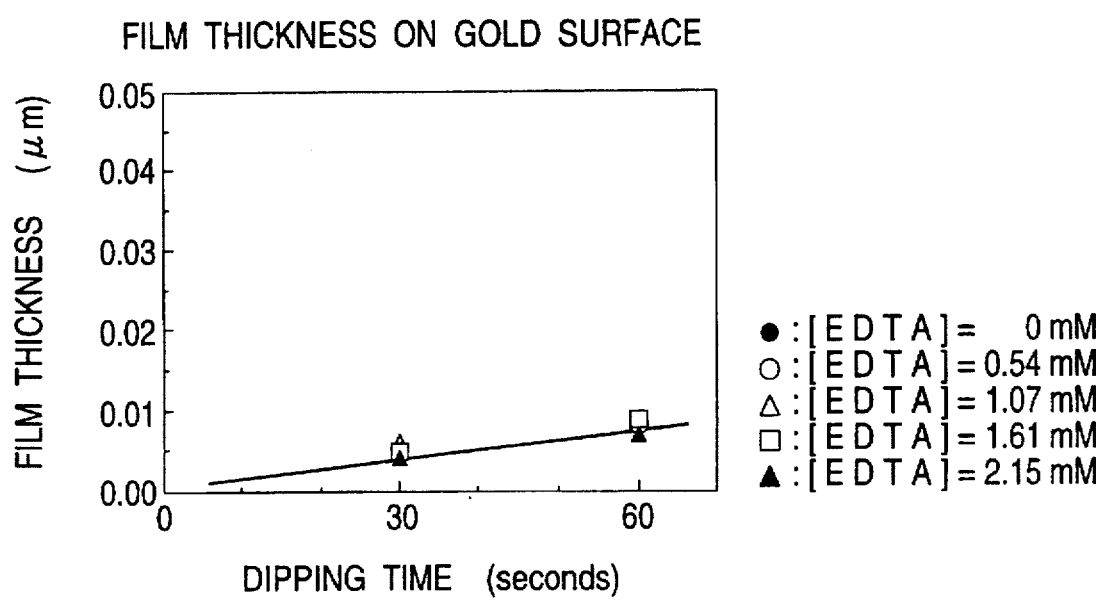
FIG. 4 shows the relationship between the treating time and the film-forming properties on gold of the surface treating agent of Example 2.

To an aqueous solution containing 0.4% 2-octylbenzimidazole, 5.0% acetic acid, and iron (II) chloride tetrahydrate of an amount giving an iron ion concentration of 30 ppm (0.54 mM) was added EDTA to a concentration of 0.54 mM, 1.07 mM, 1.61 mM or 2.15 mM to prepare a surface treating solution having a varied EDTA concentration. A PWB having test pattern 1 was dipped in the resulting solution at 40° C. for 30 seconds or 60 seconds, and the thickness of the film formed on the copper surface and the gold-plated surface was measured. The relationship between the EDTA concentration and the film forming rate on copper or gold is shown in FIGS. 3 and 4, respectively.

It is seen from the results that the film forming rate is very low at 0 ppm of EDTA, failing to achieve a requisite film thickness sufficient for anticorrosion of copper even on dipping at 40° C. for 60 seconds, whereas the film-forming properties on the copper surface is appreciably improved at an EDTA concentration of 0.54 mM or higher.

The results of Examples 1 and 2 thus prove that a combined use of iron ions and a complexon in a surface treating solution containing an imidazole compound or a benzimidazole compound brings about remarkable improvement in the rate of film formation on copper while inhibiting film formation on gold.

Further, a solder-copper mixed board was dipped in a surface treating aqueous solution containing 0.4% 2-octylbenzimidazole, 5.0% acetic acid, 0.0145% of iron (II) chloride tetrahydrate (Fe ion=30 ppm), and 0.032% EDTA (1.07 mM) at 40° C. for 60 seconds. Color change of the solder, denaturation of the surface treating solution, and film-forming properties on the copper surface as observed are shown in Table 1 below.

EXAMPLE 3

An aqueous surface treating solution containing 0.50% 2-(4-cyclohexylbutyl)benzimidazole, 4.5% formic acid, 0.058% iron (II) chloride tetrahydrate (Fe ion=120 ppm), and 0.20% nitrilotriacetic acid was prepared. The solution was kept at 40° C., and a PWB having test pattern 1 was dipped therein for 60 seconds. The chemical film formed on the surface of copper and that on the surface of gold were found to have a thickness of 0.25 µm and 0.005 µm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

EXAMPLE 4

An aqueous surface treating solution containing 0.25% 2-(5-phenylpentyl)benzimidazole, 5.0% acetic acid, 0.043% iron (III) sulfate (Fe ion=60 ppm), and 0.20% diethylenetriaminepentaacetic acid was prepared. The solution was kept at 40° C., and a PWB having test pattern 1 was dipped therein for 60 seconds. The chemical film formed on the surface of copper and that on the surface of gold were found to have a thickness of 0.31 µm and 0.003 µm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below;

EXAMPLE 5

An aqueous surface treating solution containing 0.25% 2-(1-propylbutyl)benzimidazole, 5.0% formic acid, 0.043% iron (III) chloride hexahydrate (Fe ion=90 ppm), and 0.40% triethylenetetraminehexaacetic acid was prepared. The solution was kept at 40° C., and a PWB having test pattern 1 was dipped therein for 60 seconds. The chemical film formed on the surface of copper and that on the surface of gold were found to have a thickness of 0.28 μm and 0.004 μm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

EXAMPLE 6

An aqueous surface treating solution containing 0.30% 2-nonylbenzimidazole, 6.0% acetic acid, 0.005% iron (III) chloride hexahydrate (Fe ion=10 ppm), and 0.034% glycol ether diaminetetraacetic acid was prepared. The solution was kept at 40° C., and a PWB having test pattern 1 was dipped therein for 60 seconds. The chemical film formed on the surface of copper and that on the surface of gold were found to have a thickness of 0.35 μm and 0.003 μm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

EXAMPLE 7

An aqueous surface treating solution containing 0.25% 2-phenyl-4-benzylimidazole, 5.0% acetic acid, 0.043% iron (III) chloride hexahydrate (Fe ion=150 ppm), and 0.50% 1,2-diaminocyclohexanetetraacetic acid was prepared. The solution was kept at 40° C., and a PWB having test pattern 1 was dipped therein for 60 seconds. The chemical film formed on the surface of copper and that on the surface of gold were found to have a thickness of 0.24 μm and 0.003 μm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

EXAMPLE 8

An aqueous surface treating solution containing 1.0% 2,4-diphenyl-5-methylimidazole, 5.0% acetic acid, 0.039% iron citrate (Fe ion=150 ppm), and 0.24% EDTA was prepared. The solution was kept at 40° C., and a PWB having test pattern 1 was dipped therein for 60 seconds. The chemical film formed on the surface of copper and that on the surface of gold were found to have a thickness of 0.23 μm and 0.005 μm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

EXAMPLE 9

An aqueous surface treating solution containing 1.0% 2-undecyl-4-methylimidazole, 1.0% acetic acid, 0.029% iron (III) chloride hexahydrate (Fe ion=60 ppm), and 0.16% EDTA was prepared. The solution was kept at 40° C., and a PWB having test pattern 1 was dipped therein for 60 seconds. The chemical film formed on the surface of copper and that on the surface of gold were found to have a thickness of 0.44 μm and 0.006 μm, respectively.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

Comparative Example 1

An aqueous surface treating solution containing 0.4% 2-octylbenzimidazole and 5.0% acetic acid was prepared. The solution was kept at 40° C., and a PWB having test pattern 1 was dipped therein for 60 seconds. The chemical film formed on the surface of copper and that on the surface of gold were found to have a thickness of 0.12 μm and 0.006 μm, respectively. The thickness of the film formed on the copper was insufficient for practical use due to lack of copper ions in the treating solution.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

Comparative Example 2

An aqueous surface treating solution containing 0.4% 2-octylbenzimidazole, 5.0% acetic acid, and 0.008% cupric chloride dihydrate (Cu ion=30 ppm) was prepared. A PWB having test pattern 1 was surface treated with the resulting treating solution in the same manner as in Comparative Example 1. The chemical film formed on the surface of copper and that on the surface of gold were found to have a thickness of 0.20 μm and 0.12 μm, respectively. The treating solution exhibited improved film-forming properties on the copper but, at the same time, a thick film was also formed on the gold surface.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

Comparative Example 3

An aqueous surface treating solution containing 0.4% 2-octylbenzimidazole, 5.0% acetic acid, 0.008% cupric chloride dihydrate (Cu ion=30 ppm), and 0.155% EDTA (5.30 mM) was prepared. A PWB having test pattern 1 was surface treated in the same manner as in Comparative Example 1. The chemical film formed on the surface of copper and that on the surface of gold were found to have a thickness 0.11 μm and 0.03 μm respectively. The treating solution exhibited poor film-forming properties on the copper because the copper ions were captured by the complexon.

Further, a solder-copper mixed board was dipped in the surface treating solution at 40° C. for 60 seconds. Color change of the solder, denaturation of the surface treating solution, and film-forming properties on the copper surface as observed are shown in Table 1 below.

TABLE 1

| Example No. | Color Change of Solder | Denaturation of Treating Solution | Film Forming Properties on Cu Surface |
| --- | --- | --- | --- |
| Example 1 | slightly whitened | no change | ≧0.20 μm |
| Example 2 | slightly whitened | no change | ≧0.20 μm |
| Example 3 | slightly whitened | no change | ≧0.20 μm |
| Example 4 | slightly whitened | no change | ≧0.20 μm |
| Example 5 | slightly whitened | no change | ≧0.20 μm |
| Example 6 | slightly whitened | no change | ≧0.20 μm |
| Example 7 | slightly whitened | no change | ≧0.20 μm |
| Example 8 | slightly whitened | no change | ≧0.20 μm |
| Example 9 | slightly whitened | no change | ≧0.20 μm |
| Compara. Example 1 | slightly whitened | no change | 0.1 μm |
| Compara. Example 2 | browned | precipitation | ≧0.20 μm |
| Compara. Example 3 | browned | precipitation | ≧0.20 μm |

While the invention has been described in detail and with reference to specific examples thereof, it will be apparent to one skilled in the art that various changes and modifications can be made therein without departing from the spirit and scope thereof.

What is claimed is:

1. A surface treating agent for copper and a copper alloy, comprising an aqueous solution containing (1) 0.01 to 10% by weight of an imidazole compound selected from the group consisting of a 2-alkylimidazole compound, a 2-arylimidazole compound and a 2-aralkylimidazole compound or a benzimidazole compound selected from the group consisting of a 2-alkylbenzimidazole compound, a 2-(cycloalkyltbenzimidazole) compound, a 2-arylbenzimidazole compound, a 2-aralkylbenzimidzole compound, (2) 1 to 10 moles of a chelating agent per mole of iron compound, and (3) 0.0001 to 5% by weight of iron compound.

2. A surface treating agent according to claim 1, wherein said chelating agent is a compound selected from nitrilotriacetic acid, ethylenediaminetetraacetic acid, diethylenetriaminepentaacetic acid, triethylenetetraminehexaacetic acid, 1,2-diaminocyclohexanetetraacetic acid, glycol ether diaminetetraacetic acid, ethylenediaminediacetic acid, and salts of these acids.

3. A surface treating agent according to claim 1, wherein said ion compound is iron (II) chloride, iron (III) chloride, iron (II) sulfate, iron (III) sulfate or iron (III) citrate.

4. A method for treating the surface of copper or a copper alloy comprising contacting the surface of copper or a copper alloy with an aqueous solution containing (1) 0.01 to 10% by weight of an imidazole compound selected from the group consisting of a 2-alkylimidazole compound, a 2-arylimidazole compound and a 2-aralkylimidazole compound or a benzimidazole compound selected from the group consisting of a 2-alkylbenzimidazole compound, a 2-(cycloalkylbenzimidazole) compound, a 2-arylbenzidazole compound, a 2-aralkylbenzimidazole compound, (2) 1 to 10 moles of a chelating agent per mole of iron compound, and (3) 0.0001 to 5% by weight of iron compound.

* * * * *